(12) United States Patent
Hammer et al.

(10) Patent No.: US 9,574,391 B2
(45) Date of Patent: Feb. 21, 2017

(54) CLOSURE MECHANISM FOR A MEASURING STATION

(75) Inventors: Andreas Hammer, Tittling (DE); Alexander Bartsch, Spiegelau (DE); Hermann Muhr, Prackenbach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1096 days.

(21) Appl. No.: 13/392,499

(22) PCT Filed: Aug. 16, 2010

(86) PCT No.: PCT/EP2010/005024
§ 371 (c)(1),
(2), (4) Date: Feb. 24, 2012

(87) PCT Pub. No.: WO2011/023314
PCT Pub. Date: Mar. 3, 2011

(65) Prior Publication Data
US 2012/0153790 A1    Jun. 21, 2012

(30) Foreign Application Priority Data

Aug. 26, 2009  (DE) .................. 10 2009 038 916

(51) Int. Cl.
*E05B 65/06*  (2006.01)
*E06B 5/18*  (2006.01)
(Continued)

(52) U.S. Cl.
CPC . *E06B 5/18* (2013.01); *E05D 3/06* (2013.01); *E05D 3/18* (2013.01); *E05D 15/58* (2013.01);
(Continued)

(58) Field of Classification Search
CPC .............. E06B 7/215; E06B 7/16; E06B 7/20; E06B 5/18; E06B 3/50; E06B 3/5054; E06B 3/5072; E06B 3/509; E06B 3/52; E06B 3/5009; E06B 3/5018; E05C 19/161; E05F 7/02; E05F 11/10; E05F 11/12; E05F 11/145; E05F 11/20; E05F 11/22; E05D 15/56; E05D 15/58; E05D 3/06; E05D 3/18; E05D 15/581; E05D 2015/586; E05D 2700/12; H05K 9/0016
(Continued)

(56) References Cited

U.S. PATENT DOCUMENTS 82,658 A * 9/1868 Stuhltrager ............... 16/368
116,686 A * 7/1871 Covert ............... E05D 3/022
16/233
(Continued)

FOREIGN PATENT DOCUMENTS

DE  32 04 274 A1  8/1983
DE  39 16 836 C1  3/1990
(Continued)

OTHER PUBLICATIONS

International Preliminary Report on Patentability/Written Opinion of the International Searching Authority mailed Mar. 6, 2012, issued in corresponding International Application No. PCT/EP2010/005024, filed Aug. 16, 2010.
(Continued)

*Primary Examiner* — Kristina Fulton
*Assistant Examiner* — Christine M Mills
(74) *Attorney, Agent, or Firm* — Christensen O'Connor Johnson Kindness PLLC (57) ABSTRACT

A closure mechanism for an electromagnetically sealed measuring station, which comprises a test chamber, a door for closing the test chamber, and an electromagnetic seal, which is fitted to a door frame of the test chamber. The door is moved initially in a linear manner away from the test chamber and after that pivoted in a rotating movement. The
(Continued)

closure mechanism according to the invention then seals a measuring station electromagnetically if an electromagnetic seal is fitted in a peripheral groove in the doorframe of the test chamber, and the door provides a peripheral rebate, which engages in the groove in the doorframe.

13 Claims, 5 Drawing Sheets

(51) Int. Cl.

| | | |
|---|---|---|
| *E05D 15/58* | (2006.01) | |
| *E05D 3/18* | (2006.01) | |
| *E06B 3/50* | (2006.01) | |
| *E05F 11/14* | (2006.01) | |
| *E05D 3/06* | (2006.01) | |
| *H05K 9/00* | (2006.01) | |
| *E06B 7/16* | (2006.01) | |

(52) U.S. Cl.
CPC ............... *E05F 11/145* (2013.01); *E06B 3/50* (2013.01); *E06B 3/509* (2013.01); *E06B 3/5054* (2013.01); *H05K 9/0016* (2013.01); *E05D 2015/586* (2013.01); *E06B 7/16* (2013.01)

(58) Field of Classification Search
USPC ...... 49/394, 395, 254, 257, 258, 260; 292/1, 292/302, 341.15, 158, 156, 157, 159, 161, 292/DIG. 20, DIG. 27, DIG. 69, DIG. 47, 292/DIG. 33, DIG. 68, 341.19; 16/348
See application file for complete search history.

(56) References Cited

U.S. PATENT DOCUMENTS

| | | | | |
|---|---|---|---|---|
| 529,171 | A * | 11/1894 | Hegenscheidt | 16/348 |
| 3,256,384 | A * | 6/1966 | Lindgren | 174/367 |
| 3,531,577 | A | 9/1970 | Garlington | |
| 3,768,203 | A * | 10/1973 | Bellucci | 49/254 |
| 3,788,689 | A * | 1/1974 | Lloyd | 292/304 |
| 3,981,054 | A * | 9/1976 | Hull et al. | 27/17 |
| 4,262,447 | A * | 4/1981 | Schneier et al. | 49/254 |
| 4,561,209 | A * | 12/1985 | Sohlstrom | 49/246 |
| 4,932,160 | A * | 6/1990 | Sperko | 49/254 |
| 5,199,369 | A * | 4/1993 | Meyer et al. | 114/117 |
| 5,223,670 | A * | 6/1993 | Hogan | H05K 9/0016 174/368 |
| 5,736,671 | A * | 4/1998 | Perala et al. | 174/365 |
| 6,412,221 | B1 * | 7/2002 | Emsbo | 49/154 |
| 7,090,263 | B2 * | 8/2006 | Quigley et al. | 292/302 |
| 7,404,363 | B2 * | 7/2008 | Dunstan | 109/70 |

FOREIGN PATENT DOCUMENTS

| | | | |
|---|---|---|---|
| DE | 39 07 181 A1 | 8/1990 | |
| DE | 39 19 184 A1 | 12/1990 | |
| DE | 4325174 A1 * | 5/1994 | ............ E05D 3/022 |
| EP | 0 095 743 A2 | 12/1983 | |
| EP | 0 379 898 A2 | 8/1990 | |
| EP | 0 512 406 B1 | 1/1995 | |
| EP | 0 720 422 A2 | 7/1996 | |
| WO | 2004/090270 A2 | 10/2004 | |

OTHER PUBLICATIONS

International Search Report mailed May 11, 2010, issued in corresponding International Application No. PCT/EP2010/005024, filed Aug. 16, 2010.

* cited by examiner

CLOSURE MECHANISM FOR A MEASURING STATION

The invention relates to a closure mechanism for an electromagnetically sealed measuring station, which comprises a test chamber, a door for closing the test chamber and an electromagnetic seal, which is preferably attached to a door frame of the test chamber.

Electromagnetically sealed measuring stations are often used in technical and also medical fields in order to determine electromagnetic properties without the influence of environmental, radiated noise. For instance, the high-frequency properties of mobile-radio user devices are accurately characterised during development in order promptly to identify and resolve errors or irregularities in the corresponding component groups.

A test chamber of this kind comprises an exterior metallic housing. The housing wall is lined on the inside with absorber material in order to prevent reflected radiation. A device under test is then introduced through a door into the interior of the test chamber. Such a door represents a potential weakness in the screening of the test chamber and must therefore be embodied in such a manner that it can be securely electromagnetically sealed.

DE 39 19 184 A1 describes a walk-in test chamber for a bio-magnetic measuring station, which comprises several shells for screening the magnetic and electrical components of electromagnetic external fields and is provided with a horizontally two-part door. Each half door is mounted on hinge plates which can be pivoted by means of hinges about the hinge bearer, which is attached by means of straps to the wall of the chamber. Each half door is fitted with its own door handle, which is also fitted with its own closing mechanism, which guides a locking cylinder into the associated locking block. In order to embody the slot between the two half doors in an electromagnetically sealed manner, the edges of the half doors facing towards the slot are provided with lips made of flexible sealing material. Moreover, the slot between the half doors is provided with a pivoting covering plate attached to a hinge. To ensure that an adequate electromagnetic contact exists between the half doors, the covering plate is provided with pins, which enter the slot between the half doors and provide an additional contact of the two sides.

In order to achieve such a good electromagnetic seal for the entire door, the outer edge of the half doors must also be provided with sealing pins, and the door frame must be provided with sealing material. However, when opening the doors using a normal rotational hinge, the disadvantage arises that the pins engaging in the sealing material stress the sealing material more strongly on one side by pressing together the seal on the side facing towards the hinge and the sealing material there wears out more rapidly as a result. Even with an average use of the electromagnetic measuring station with 80 opening cycles per day, the sealing material becomes deformed after a short time to such an extent that the electromagnetic seal is no longer guaranteed.

The object is therefore presented of providing a closure mechanism for a securely electromagnetically sealed door of a measuring station, which guarantees a good electromagnetic seal and applies minimal stress and therefore minimal wear on the sealing material.

The object is achieved by the closure mechanism according to the invention as specified in claim 1. The dependent claims specify advantageous further developments of the mechanism according to the invention.

The closure mechanism according to the invention for an electromagnetically sealed measuring station, which comprises a test chamber, a door for closing the test chamber and an electromagnetic seal, which is preferably mounted on a door frame of the test chamber, initially moves the door away from the door frame in a linear manner in the direction perpendicular to the plane of the door and then pivots it open in a rotational movement. The sealing material is de-stressed by the initial linear movement. Only after an adequate removal of the door from the sealing material does the rotational movement begin. With the closing of the door, the door and the seal are not in contact during the rotational movement so that a twisting inwards of the seal, which often occurs with a conventional pivoting door, does not occur.

The closure mechanism according to the invention is suitable in a particularly advantageous manner if the electromagnetic seal is fitted in at least one peripheral groove in the door frame of the test chamber and the door provides at least one peripheral rebate. The engagement of the door rebate in a groove in the door frame provided with a sealing material forms a very good electromagnetic seal, which, however, suffers in the case of a purely rotational movement when opening the door. With the closure mechanism according to the invention, the at least one rebate and, correspondingly, the at least one grove in the door frame can be designed to be sufficiently long or respectively sufficiently deep in order to satisfy even very stringent sealing requirements.

The door is advantageously integrated within an auxiliary frame and can be moved within the auxiliary frame perpendicular to the plane of the closed door. The auxiliary frame is connected by several rotational hinges to a side wall of the test chamber. This structure allows the use of conventional rotational hinges for the rotational movement of the test chamber door. Through the choice of the thickness of the auxiliary frame, the closure mechanism can be used with doors with a different depth of rebate or with different depths of grooves in the door frame.

A first and a second guide system are advantageously attached to the test chamber above and below the door. A plurality of guide pins are connected to the door in a form-fit or material-fit manner. Through the attachment of the guide system to the test chamber, only the weight of the guide pins is borne by the door, so that the measuring station does not tilt in the direction of the door when the door is opened.

A guide system advantageously comprises at least two rail portions, which are connected to one another at one end in a displaceable manner via a coupling element. A diagonal slot is formed in each case at the end regions of the rail portions facing away from the coupling element. By rotating the coupling element mounted in a displaceable manner, the at least two rail portions are guided outwards parallel to the door. The guide pins engage in each case in a diagonal slot in the guide system and are guided in a linear manner in the direction perpendicular to the door. The mechanism described allows the door to be moved out of the groove in the door frame against the friction between the door rebate and the seal material with minimal expenditure of energy. Even a heavy door can be withdrawn effortlessly from the door frame in this manner. This linear movement of the door allows the groove or the door rebate to be formed over the entire periphery of the door frame or respectively of the door, also, especially in the corners, and accordingly to seal the door electromagnetically without gaps.

Exemplary embodiments of the closure mechanism according to the invention are presented in a simplified manner in the drawings by way of example and are explained in greater detail with reference to the following description. The drawings are as follows.

Mutually corresponding parts are marked with the same reference numbers in all of the drawings.

Figure 1:
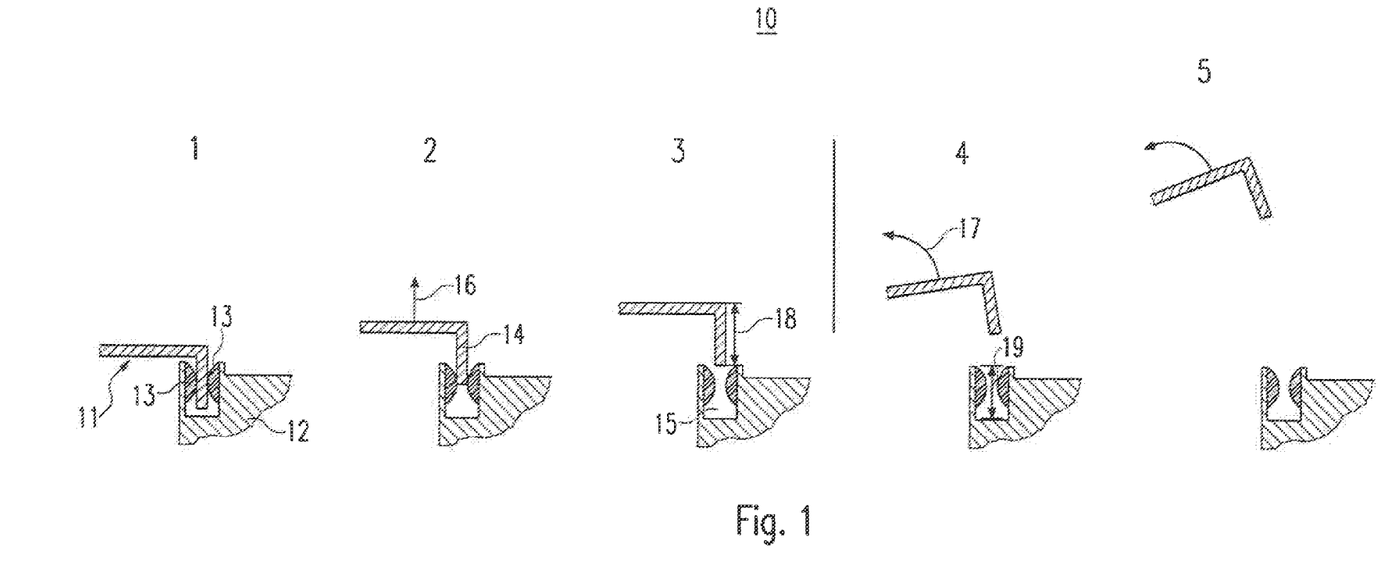
FIG. 1 shows a schematic process of the closure mechanism according to the invention in a plan view.

FIG. 1 shows a schematic process 10 of a closure mechanism according to the invention in five phases. In the first phase shown in the cross-sectional drawing headed with 1, a door 11, which provides a door rebate 14, is illustrated. This door rebate 14 can be formed around the entire periphery of the door. The door frame 12 provides a groove 15, which is formed entirely or partially around the periphery of the door frame 12 corresponding to the door rebate 14. A seal 13, here, in the form of two parts, is inserted and fixed in the groove. The depth 18, 19 of the door rebate 14 and of the groove 15 in the door frame 12 and the type and shape of the seal 13 can be selected corresponding to the required electromagnetic seal. Several grooves 15 and the corresponding number of door rebates 14 can be provided in the door frame and on the door 11 respectively.

From this closed position in phase 1, the door 11 is moved outwards from the groove 15 in the door frame 12 in a linear movement perpendicular to the plane of the door in the direction of the arrow 16, as illustrated in phase 2. In phase 3, the door rebate 14 is disposed completely in front of the door frame 12. Now, the rotational movement, indicated by the arrow 17 in phase 4 of the movement process, begins. With a further rotational movement 17, see phase 5, the door is pivoted open up to its stop, which should preferably be disposed at around at least 90°.

Figure 2:
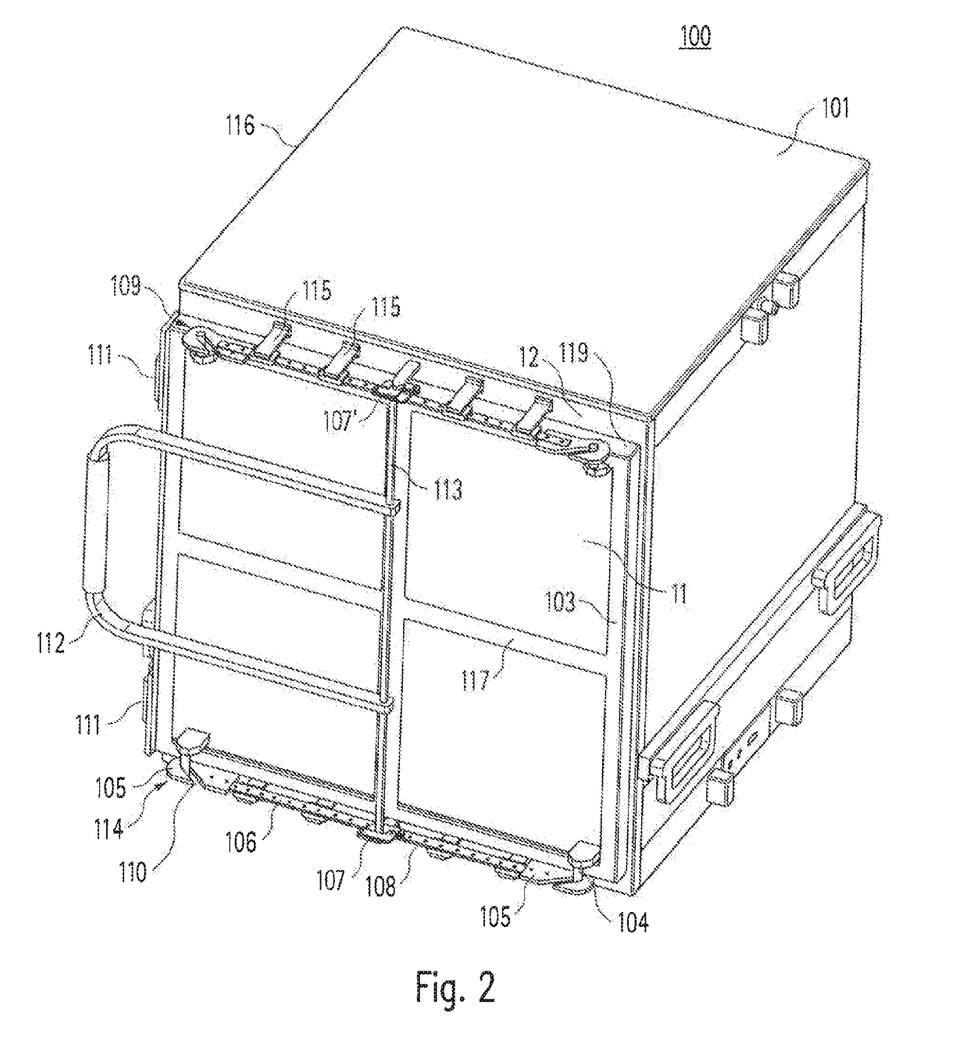
FIG. 2 shows an exemplary embodiment of an electromagnetically sealed measuring station with a closure mechanism according to the invention in a perspective view.

FIG. 2 shows a measuring station 100, of which the door is provided with a closure mechanism according to the invention. The measuring chamber 101 is closed by a door 11 on the side facing towards the observer. An auxiliary frame 103 with a supporting cross 117 surrounds the door 11. The auxiliary frame 103 provides a depth 19, which corresponds at least to the depth of the door 11 including the depth of the door rebate 14. The door 11 is mounted within the auxiliary frame 103 at several points in a sliding manner for example, via sliding rails or short telescopic arms. The auxiliary frame 103 is held by at least two hinges 111, which are attached to a side wall 116. A plurality of guide pins 104 are attached in a form-fit or material-fit manner to the door 11. For example, four guide pins 104 can be welded, screwed, riveted or also glued in each corner of the door 11.

A first and second guide system 109, 114 are disposed respectively above and below the door 11 on the door frame 12 of the test chamber 101. Each guide system 109, 114 comprises a first and a second rail portion 106, 108, which are connected by a coupling element 107, 107' and each provide an end region 105, in which a diagonal slot 110 is machined. The coupling elements 107, 107' of the first and second guide system 109, 114 are connected rigidly to one another by a connecting rod 113. By means of a turning shackle 112 connected rigidly to the connecting rod 113, the connecting rod 113 and therefore also the coupling elements 107, 107' are rotated through 180°. The connecting rod 113 is additionally attached to the front side of the auxiliary frame 103 and is released from the coupling elements 107, 107' for the pivoting of the door 11.

The turning shackle 112 in the exemplary embodiment is formed as an elongated U-shape, so that a force to be applied per angle of rotation is very small. The coupling elements 107 and respectively 107' are once again connected to the at least two rail portions 106, 108 in such a manner that these are guided outwards parallel to the door 11. These two rail portions 106, 108 are held in a sliding manner in a plurality of rail holders 115 which are attached to the door frame 12 of the test chamber 101.

The closure mechanism according to the invention is illustrated in FIGS. 3-6 for a first exemplary embodiment and in FIGS. 7-9 for a second exemplary embodiment and is explained in detail in the following section.

Figure 3:
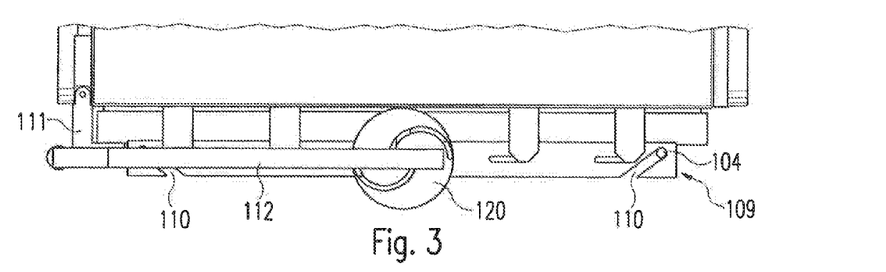
FIG. 3 shows a first exemplary embodiment of a closure mechanism according to the invention in the closed condition in a plan view.

A detail of the test chamber 101, the auxiliary frame 103, the hinge 111 and a guide system 104 with crank disc 120 as the coupling element 107 and the turning shackle 112 are illustrated in plan view. FIG. 3 shows the closed door with the turning shackle 112 folded to the left. The first and second rail portions 106, 108 each provide boreholes 130, in which the pins of the rail holder 115 engage and accordingly guide and carry the rail portions 106, 108. A diagonal slot 110 is formed in each end region of the first and second rail portion 106, 108. A guide pin 104 engages through each diagonal slot 110. In the closed condition of the door 11, the guide pin 104 is disposed at the end opposite to the opening of the diagonal slot. The crank disc 120 is disposed in the middle between the first and second rail portion 106, 108, wherein, in each case, one sliding block 123 on the first and respectively second rail portion 106, 108 is introduced into a crank slot 121 of the crank disc 120.

Figure 4:
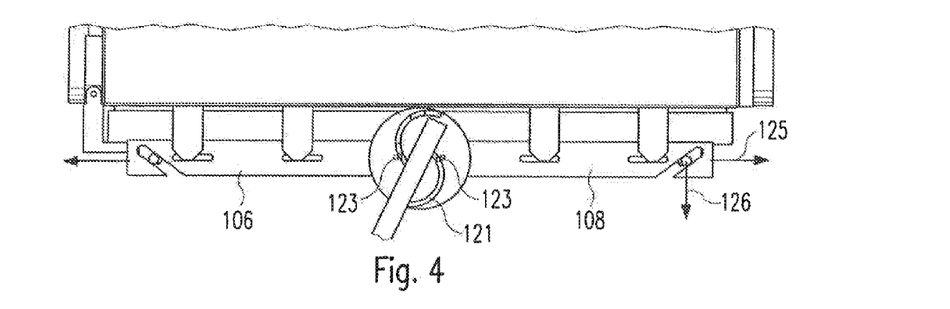
FIG. 4 shows a first exemplary embodiment of a closure mechanism according to the invention during the linear movement phase in a plan view.

If the turning shackle 112, which is attached in this exemplary embodiment to the opposing crank discs 120, 120', as illustrated in FIG. 4, is turned out of its resting position, the sliding blocks 123 run radially outwards along the rotated crank slots 121. The first and second rail portion are each moved outwards in the direction of the arrow 125. The guide pin 104 is guided outwards in the direction of the arrow 126 perpendicular to the plane of the door.

Figure 5:
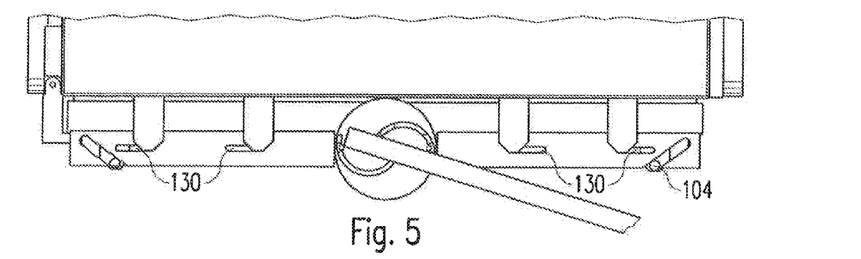
FIG. 5 shows a first exemplary embodiment of a closure mechanism according to the invention at the end of the linear movement phase in a plan view.

FIG. 5 shows the closure mechanism at the end of the linear phase. The guide pin 104 has now reached the open end of the diagonal slot 110; the turning shackle 112 has been rotated through almost 180° to the other side of the door 11.

Figure 6:
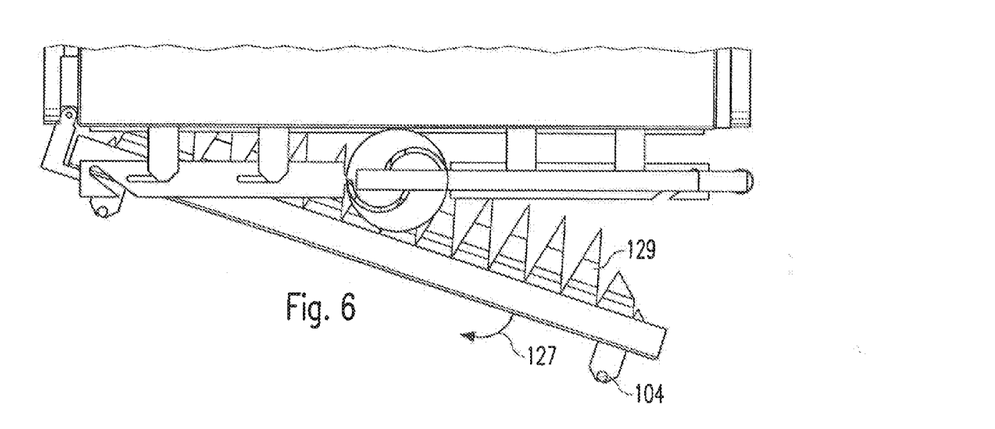
FIG. 6 shows a first exemplary embodiment of a closure mechanism according to the invention in the rotational phase in a plan view.

FIG. 6 now shows the closure mechanism in the rotational phase. The door 11 including the auxiliary frame 103 is rotated via a handle on the right-hand side, which is not illustrated, about the hinge 111 in the direction of the arrow 127. Absorber material 129 attached to the inside of the door 11 becomes visible.

Figure 7:
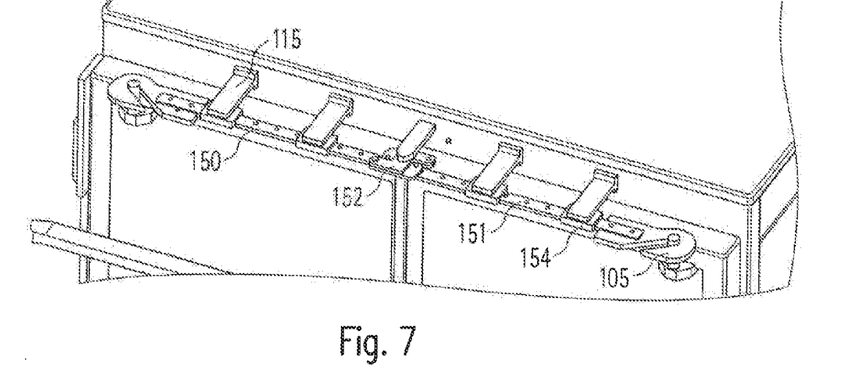
FIG. 7 shows a second exemplary embodiment of a closure mechanism according to the invention in the closed condition in a perspective view.
Figure 8:
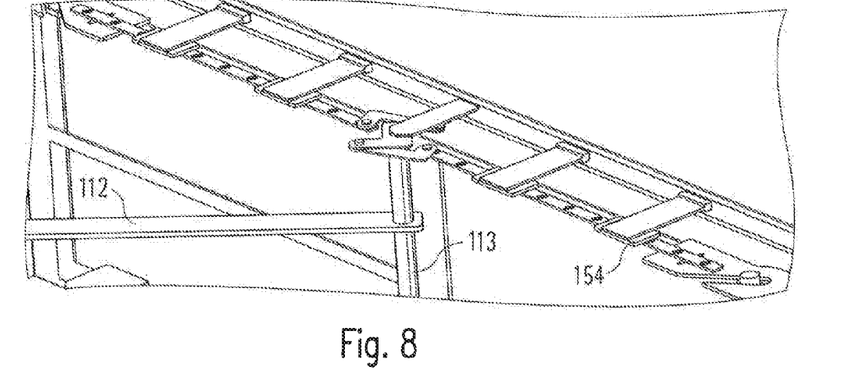
FIG. 8 shows a second exemplary embodiment of a closure mechanism according to the invention during the linear movement phase in a perspective view.
Figure 9:
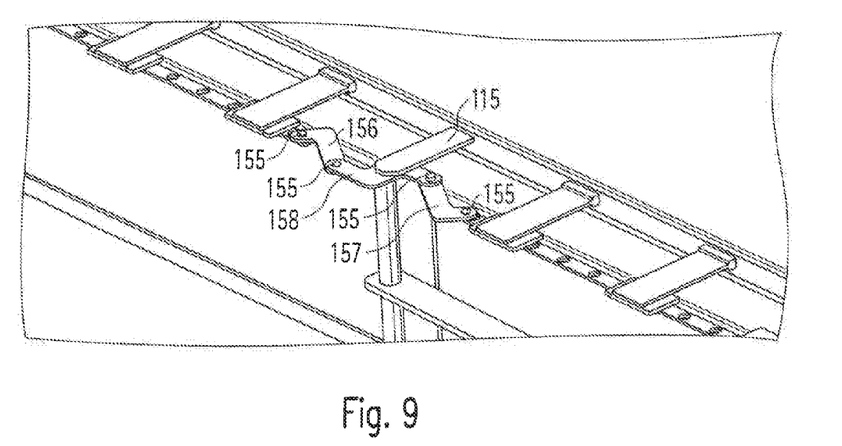
FIG. 9 shows a second exemplary embodiment of a closure mechanism according to the invention in a perspective view at the end of the linear movement phase.

FIGS. 7-9 show a second exemplary embodiment of the closure mechanism according to the invention. This differs from the first exemplary embodiment only through the design of the first and second guide system 109, 114. The door 11, the auxiliary frame 103 and its suspension on the hinges 111 are designed in the same manner as in the first exemplary embodiment.

A guide system is attached to the door frame 12 by means of rail holders 115 respectively above and below the door 11. The first and second rail portion are designed as a rod-linkage portion 150, 151. In order to balance the weight distribution of the test chamber and to keep the first and second guide system 109, 114 light in weight, the rod-linkage portions 150, 151 are designed as narrow, sturdy rods manufactured from lightweight material. The rod-linkage portions 150, 151 are guided by the rail holders 115 and guide elements 154 attached to the latter. The end region 105 of every rod-linkage portion 150, 151 further provides a diagonal slot 110, in which the guide pin 104 is guided. An expanding joint 152, which is connected in a movable manner to the two rod-linkage portions 150, 151 by means of pins 155, serves as the coupling element The expanding joint 152 comprises two L-shaped joint arms 156, 157, which are connected to one another in a movable manner with a middle element 158. The middle element 158 is formed as a double L-shape, wherein the two L-shaped components are arranged in a manner rotated through 180° about the middle of the shorter arm. The middle element 158 is rotatable at one side in the middle of the short arm with a rail holder 115, and is rigidly connected at the other side to the connecting rod 113.

In order to open the door 11, the turning shackle 112 is pivoted in a circular movement to the other side thereby rotating the connecting rod and the middle element 158 attached to it. The joint arms 156, 157 articulated on the long arms of the middle element 158 in a rotatable manner via pins 155 are now expanded and push the first and second rod-linkage portions 150, 151 articulated at the end of the short arm of the first and second joint arm 156, 157 outwards. The guide pin 104 is then moved within the diagonal slot 110 away from the door frame 12 in the direction perpendicular to the door. The door 11 and respectively the door rebate 14 is withdrawn perpendicular to the plane of the door in a sliding manner from the groove in the door frame 12 within the auxiliary frame 103. As soon as the guide pin 104 has reached the open end of the diagonal slot 104, the door can be pivoted about the hinge 111 via a handle, which is not illustrated here.

The present invention is not restricted to the two exemplary embodiments described. Accordingly, the guide systems 109, 114 can also be attached to the door frame at the sides of the door 11, and the door 11 can be pivoted upwards or downwards respectively. Similarly, in the exemplary embodiments described, an opening of the door 11 with a right hand stop is possible, by attaching the hinges 111 to the right-hand side wall instead of to the left-hand side wall. Moreover, the turning shackle 112 can be replaced by a lever handle which rotates the connecting rod 113 by means of gear wheels. A lever handle of this kind can at the same time be used for the pivoting of the door.

In order to avoid an accidental opening of the door, a locking device can be provided for the turning shackle or respectively for a lever handle. For example, a rotary handle can engage with a clamp holder and can be locked in this manner. A lever handle can be secured against rotation, for example, by a lock.

Figure 10:
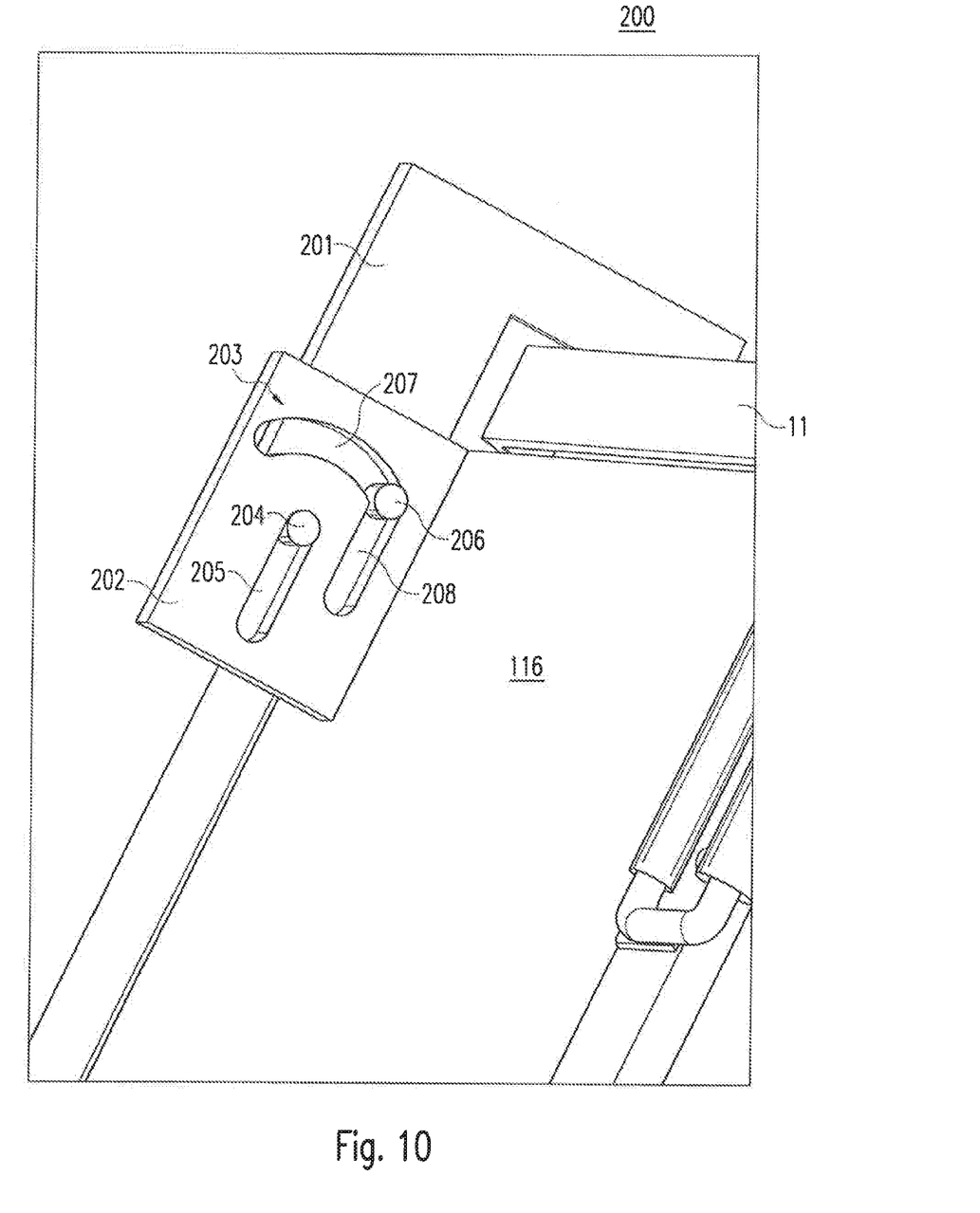
FIG. 10 shows an exemplary embodiment of a hinge according to the invention in a perspective view.

Instead of attaching a conventional hinge 111 to an auxiliary frame 103, a special hinge 200 can be attached directly to the door 11. As illustrated in FIG. 10, the special hinge 200 comprises a hinge arm 201, which is rigidly connected to the door 11, and a hinge plate 202, which is rigidly connected to the side wall 116 of the test chamber 101. Two hinge pins 204, 206 are formed on the hinge arm 201, wherein the first hinge pin 204 engages in a longitudinal slot 205, and a second hinge pin 206 engages in a turning slot 203. The turning slot 203 is formed by a longitudinal portion 208 and an adjoining curved portion 207. The longitudinal slot 205 and the longitudinal portion 208 of the turning slot 203 are of the same length and determine the maximum deflection of the door through the linear movement perpendicular to the plane of the door. The curved portion 207 is formed as a circular segment, of which the sweeping angle determines the opening angle of the special hinge 200. The end of the longitudinal slot 205 facing towards the curved portion 207 forms the mid-point of the circular segment.

By means of a transverse shackle, which is not illustrated but extends over the entire width of the door and is attached to the door 11, the closed door 11 is withdrawn forward out of the groove in the door frame perpendicular to the plane of the door until the hinge pins reach the end of the longitudinal slot 205 or respectively of the longitudinal portion 208 of the turning slot 203. After this, through a movement within the curved portion 207, the door is pivoted. This special hinge 200 is orientated in such a manner that the hinge plate 202 is disposed parallel to the plane of rotation of the door.

All of the elements of the closure mechanism according to the invention, such as the at least one guide pin 104, the guide system 109, 114 and the hinges 111, 200, are attached to the door 11 or respectively the auxiliary frame 103 and the side wall 116 of the test chamber 101 outside the screened region and without through passage into the screened region of the test chamber. The named elements are attached, for example, by welding, soldering or by screws, which do not penetrate the wall of the test chamber. Accordingly, additional electromagnetic seals are not required, and the electromagnetic field in the interior of the test chamber is not influenced.

All of the features described and/or illustrated can be advantageously combined with one another within the framework of the invention. The invention is not restricted to the exemplary embodiments.

The invention claimed is:
1. A closure mechanism for an electromagnetically sealed measuring station, the closure mechanism comprising:
a door frame comprising a groove around its entire periphery;
a door comprising a door rebate around its entire periphery corresponding to said groove, so that the door attached to the door frame can be moved outward from the groove of the door frame perpendicular to a plane of the door in a closed position in the direction away from a test chamber to which the closure mechanism is associated;
a special hinge connected to a side wall of the test chamber, the special hinge comprising a hinge plate and a hinge arm, wherein the hinge plate provides a plurality of slots, wherein the hinge arm includes two hinge pins, wherein movement of the hinge pins within the slots provide linear and pivotal movements of the door, and wherein the hinge pins do not detach from the slots; and a seal configured to create an electromagnetic seal between the door and the door frame around an entire periphery of the door when the door is in the closed position;

wherein the door is attached to the door frame in such a manner that the door can be moved initially in a linear manner away from the door frame and the test chamber in a direction perpendicular to the plane of the door so that the door rebate moves out of the groove over the entire periphery and can then be pivoted in a rotational movement, wherein an auxiliary frame is connected to the side wall of the test chamber by rotational hinges;

wherein the door is built into the auxiliary frame such the movement of the door in the linear manner away from the door frame occurs within the auxiliary frame; and wherein the seal can be stressed or de-stressed over the entire periphery of the door by movement of the door in the linear manner.

2. The closure mechanism according to claim 1, wherein at least one guide pin is connected to the door in a form-fit or material-fit manner.

3. The closure mechanism according to claim 1, wherein the auxiliary frame is connected to the side wall of the test chamber by at least two rotational hinges.

4. The closure mechanism according to claim 1, wherein a first and a second guide system are attached to the test chamber above and/or below the door.

5. The closure mechanism according to claim 4, wherein the first or second guide system comprises at least two rail portions, which are connected at one end via a coupling element in a movable manner relative to one another, and wherein the at least two rail portions each provide a diagonal slot at the respectively opposite end region.

6. The closure mechanism according to claim 5, wherein the coupling element is mounted in a movable manner, and the movement of the coupling element guides the at least two rail portions outwards parallel to the door.

7. The closure mechanism according to claim 5, wherein each of several guide pins engages a respective one of the diagonal slots within the guide system and are guided in a linear manner within the guide system in the direction perpendicular to the door.

8. The closure mechanism according to claim 1, wherein the door is displaced in the linear manner between 1 cm and 5 cm.

9. The closure mechanism according to claim 1, wherein the seal is formed as a metallic spring.

10. The closure mechanism according to claim 1, wherein the plurality of slots includes a longitudinal slot and a turning slot in which the two hinges pins of the hinge arm are guided, wherein the turning slot comprises a longitudinal portion and a curved portion.

11. The closure mechanism according to claim 8, wherein the door is displaced by moving in the linear manner between 2 cm and 3 cm.

12. A measuring station, comprising:
a test chamber; and
a closure mechanism associated with the test chamber, the closure mechanism including
a door frame comprising a groove around its entire periphery,
a door attached to the door frame and configured to close the test chamber, the door including a door rebate around its entire periphery corresponding to said groove so that the door can be moved outwards from the door frame, away from the test chamber and perpendicular to a plane of the door in a closed position, a special hinge connected to a side wall of the test chamber, the special hinge comprising a hinge arm and a hinge plate, wherein the hinge plate provides a plurality of slots, wherein the hinge arm includes two hinge pins, wherein movement of the hinge pins in the slots provide linear and pivotal movements of the door, and wherein the hinge pins do not detach from the slots; and
a seal,
wherein the door is attached to the frame in such a manner that it can be moved initially in a linear manner away from the test chamber in a direction perpendicular to the plane of the door so that the door rebate moves out of the groove over the entire periphery and can then be pivoted in a rotational movement,
wherein an auxiliary frame is connected in a pivoting manner to the side wall of the test chamber by rotational hinges,
wherein the door is built into the auxiliary frame such that movement of the door in the linear manner away from the test chamber occurs within the auxiliary frame; and
wherein the seal can be stressed or de-stressed over the entire periphery of the door by movement of the door in the linear manner.

13. The measuring station according to claim 12, wherein the hinge plate provides a longitudinal slot and a turning slot in which the two hinge pins of the hinge arm are guided, and wherein the turning slot comprises a longitudinal portion and a curved portion and wherein the hinge pins do not come out of the slots.

* * * * *

UNITED STATES PATENT AND TRADEMARK OFFICE
CERTIFICATE OF CORRECTION

PATENT NO. : 9,574,391 B2  
APPLICATION NO. : 13/392499  
DATED : February 21, 2017  
INVENTOR(S) : A. Hammer et al.

Page 1 of 1

It is certified that error appears in the above-identified patent and that said Letters Patent is hereby corrected as shown below:

In the Claims

| Column | Line | Error |
|---|---|---|
| 7<br>Claim 1 | 18 | "such the" should read --such that the-- |
| 8<br>Claim 10 | 5 | "two hinges" should read --two hinge-- |

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*